(12) United States Patent
Matsuura

(10) Patent No.: US 10,772,219 B2
(45) Date of Patent: Sep. 8, 2020

(54) COPPER FOIL WITH CARRIER, COPPER FOIL WITH RESIN AND METHOD FOR MANUFACTURING PRINTED WIRING BOARD

(71) Applicant: MITSUI MINING & SMELTING CO., LTD., Tokyo (JP)

(72) Inventor: Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 102 days.

(21) Appl. No.: 16/065,519

(22) PCT Filed: Dec. 1, 2016

(86) PCT No.: PCT/JP2016/085746
§ 371 (c)(1),
(2) Date: Jun. 22, 2018

(87) PCT Pub. No.: WO2017/110404
PCT Pub. Date: Jun. 29, 2017

(65) Prior Publication Data
US 2018/0376602 A1    Dec. 27, 2018

(30) Foreign Application Priority Data

Dec. 25, 2015 (JP) ................... 2015-254479

(51) Int. Cl.
*H05K 3/46* (2006.01)
*B32B 9/00* (2006.01)
(Continued)

(52) U.S. Cl.
CPC ............ *H05K 3/4682* (2013.01); *B32B 9/00* (2013.01); *B32B 15/08* (2013.01);
(Continued)

(58) Field of Classification Search
CPC .. H05K 3/4682; H05K 3/4652; H05K 1/0296; H05K 3/0032; H05K 3/06;
(Continued)

(56) References Cited

U.S. PATENT DOCUMENTS

2008/0200333 A1\* 8/2008 Gotou ................. B32B 15/08
503/225
2009/0291319 A1   11/2009 Nagatani et al.
(Continued)

FOREIGN PATENT DOCUMENTS

CN      101454153 A    6/2009
JP      H05-12630 A    4/1993
(Continued)

OTHER PUBLICATIONS

Office Action for CN App. No. 201680063741.1 dated Jun. 27, 2019 (w/ translation).
(Continued)

*Primary Examiner* — Michael N Orlando
*Assistant Examiner* — Cynthia L Schaller
(74) *Attorney, Agent, or Firm* — Greenblum & Bernstein, P.L.C.

(57) ABSTRACT

There is provided a copper foil with a carrier particularly suitable for a circuit forming process for removing a carrier after laser drilling and desmear treatment, in detail, a copper foil with a carrier having high heat press resistance (heat resistance) of the carrier, laser drilling performance, corrosion resistance of the carrier against the desmear treatment, corrosion resistance of a release layer against the desmear treatment, and carrier release strength. The copper foil with a carrier comprises a carrier comprising at least one resin selected from polyethylene naphthalate (PEN) resins, polyethersulfone (PES) resins, polyimide resins, and polyphenylene sulfide resins; a silicon layer provided on the
(Continued)

carrier, the silicon layer mainly containing silicon; a carbon layer provided on the silicon layer, the carbon layer mainly containing carbon; and an extremely thin copper layer provided on the carbon layer.

11 Claims, 5 Drawing Sheets

(51) Int. Cl.
| | | |
|---|---|---|
| C23C 14/20 | (2006.01) | |
| C23C 18/18 | (2006.01) | |
| C23C 18/16 | (2006.01) | |
| C25D 5/02 | (2006.01) | |
| B32B 15/08 | (2006.01) | |
| C23C 14/06 | (2006.01) | |
| C23C 14/35 | (2006.01) | |
| H05K 1/02 | (2006.01) | |
| H05K 3/00 | (2006.01) | |
| H05K 3/06 | (2006.01) | |
| C25D 1/04 | (2006.01) | |
| H05K 3/10 | (2006.01) | |
| C23C 18/38 | (2006.01) | |

(52) U.S. Cl.
CPC .......... *C23C 14/0605* (2013.01); *C23C 14/20* (2013.01); *C23C 14/205* (2013.01); *C23C 14/35* (2013.01); *C23C 18/1653* (2013.01); *C23C 18/1882* (2013.01); *C25D 5/022* (2013.01); *H05K 1/0296* (2013.01); *H05K 3/0032* (2013.01); *H05K 3/06* (2013.01); *H05K 3/4652* (2013.01); *C23C 18/38* (2013.01); *C25D 1/04* (2013.01); *H05K 3/108* (2013.01); *H05K 2201/0323* (2013.01); *H05K 2201/0338* (2013.01); *H05K 2201/0355* (2013.01); *H05K 2201/09509* (2013.01); *H05K 2203/0156* (2013.01); *H05K 2203/072* (2013.01); *H05K 2203/107* (2013.01)

(58) Field of Classification Search
CPC . H05K 2201/0323; H05K 2201/09509; H05K 2201/0338; H05K 3/108; H05K 2201/0355; H05K 2203/0156; H05K 2203/072; H05K 2203/107; H05K 1/0313; H05K 1/09; H05K 2201/0145; H05K 2201/015; B32B 9/00; B32B 15/08; B32B 15/04; C23C 14/205; C23C 18/1882; C23C 18/1653; C23C 14/0605; C23C 14/20; C23C 14/35; C23C 18/38; C23C 14/0005; C23C 28/322; C23C 28/34; C25D 5/022; C25D 1/04
See application file for complete search history.

(56) References Cited

U.S. PATENT DOCUMENTS

| | | | | |
|---|---|---|---|---|
| 2011/0014453 | A1* | 1/2011 | Ohigashi | H05K 3/4655 428/221 |
| 2014/0227548 | A1* | 8/2014 | Myrick | C06B 45/30 428/570 |
| 2015/0101848 | A1 | 4/2015 | Cho et al. | |

FOREIGN PATENT DOCUMENTS

| | | | |
|---|---|---|---|
| JP | 2008-255462 | A | 10/2008 |
| JP | 2009094191 | A | 4/2009 |
| JP | 4726855 | B2 | 7/2011 |
| JP | 2015-076610 | A | 4/2015 |
| JP | 2015-104891 | A | 6/2015 |
| JP | 2015-157472 | A | 9/2015 |
| WO | 2013/183606 | A1 | 12/2013 |

OTHER PUBLICATIONS

Office Action issued in JP 2017-557829, dated Nov. 30, 2018, with English translation.
Office Action for JP App. No. 2017-557829, dated Jun. 10, 2019 (w/ English-language translation).
International Search Report issued with respect to Patent Application No. PCT/JP2016/085746, dated Feb. 21, 2017.
International Preliminary Report on Patentability issued with respect to Patent Application No. PCT/JP2016/085746, dated Jun. 26, 2018.

* cited by examiner

COPPER FOIL WITH CARRIER, COPPER FOIL WITH RESIN AND METHOD FOR MANUFACTURING PRINTED WIRING BOARD

TECHNICAL FIELD

The present invention relates to a copper foil with a carrier, a resin-coated copper foil, and a method for manufacturing a printed circuit board.

BACKGROUND ART

In recent years, a modified semi-additive process (MSAP) has been widely employed for manufacturing printed circuit boards suitable for miniaturization of circuits. The MSAP is suitable for forming extremely fine circuits and is carried out using copper foil with a carrier to take its advantageous characteristics. For example, as shown in FIGS. 4 and 5, an extremely thin copper layer 118 of copper foil with a carrier is pressed against and tightly bonded to a resin substrate provided with a resin layer 122 on a core layer 124 having an inner conductor 126 using a primer layer 119, and then the carrier (not shown) is removed (step (a)). A via hole 128 is then formed by laser drilling, and the inside of the via hole 128 is desmeared (step (b)). After an electroless copper plating layer 130 is formed (step (c)), masking is performed in a predetermined pattern by exposure and development using a photoresist 131 (step (d)) and an electrolytic copper plating layer 132 is formed (step (e)). After the photoresist 131 is removed to form the wiring portion 132a (step (f)), unnecessary portions such as extremely thin copper foil between the adjacent wiring portions 132a are removed by flash etching over the entire thickness thereof (step (g)) to form a lead line 134 in a predetermined pattern.

In recent years, downsizing and sophistication of electronic devices, such as portable electronic devices, demand printed circuit boards having further miniaturized (finepitched) wiring patterns. To meet such a requirement, a copper foil for manufacturing a printed circuit board is desired to have a smaller thickness than current ones. Accordingly, a technique has been proposed for forming a copper foil layer for a copper foil with a carrier by vapor deposition such as sputtering. For example, Patent Document 1 (JP4726855B2) discloses a copper foil with a carrier sheet. The copper foil with a carrier sheet has a copper foil layer on the surface of the carrier sheet via a joint interface layer therebetween. The joint interface layer consists of two layers (a metal layer and a carbon layer) and the copper foil layer was prepared by forming a first copper layer having a thickness of 10 nm to 300 nm on the joint interface layer by physical vapor deposition and further forming a second copper layer by electrolysis. This document also discloses that the metal layer of the joint interface layer may be composed of any one of tantalum, niobium, zirconium, nickel, chromium, titanium, iron, silicon, molybdenum, vanadium, and tungsten. The copper foil with a carrier disclosed in Patent Document 1 has an industrially adoptable stable release strength between the carrier foil layer and the copper foil layer even at a pressing temperature exceeding 300° C.

A copper foil with a resin film carrier is known. For example, Patent Document 2 (JP2015-157472) discloses a copper foil with a release film. The copper foil with a release film consists of a copper layer provided on a release layer of a release film, and the release layer consists of a metal layer and a carbon layer formed in this order on the release film. According to this document, preferred examples of the metal layer include aluminum, zinc, titanium, chromium, iron, cobalt, nickel, germanium, platinum, gold, and lead, while preferred examples of the polymer of the film include polyimides, polyethylene terephthalate, polyethylene naphthalate, polybutylene terephthalate, syndiotactic polystyrene films, aromatic polyamide films, modified polyphenylene ether films, fluorine-based films, and liquid crystal polymer films.

CITATION LIST

Patent Documents

Patent Document 1: JP4726855B2
Patent Document 2: JP2015-157472A

SUMMARY OF INVENTION

The MSAP described above has the following problems. First, resin debris occurring during laser drilling may adhere to the extremely thin copper layer to interfere with the formation of the wiring pattern. Second, extremely thin copper layer is suitable for formation of fine patterns; however if desmear treatment or electroless plating (especially soft etching which is a pretreatment thereof) is carried out after removal of the carrier, the extremely thin copper layer is likely to have pinholes by etching, which may result in defects of the wiring pattern. Accordingly, it would be convenient if the carrier could be removed after laser drilling and desmear treatment of the laminated body with the carrier. In other words, this is a technique to consistently perform laser drilling and desmear treatment in one succession on the laminated body with the carrier. Unfortunately a metal carrier, such as a copper foil requires considerably high energy for laser drilling. For example, it is difficult to make a hole in a metal carrier with a carbon dioxide gas laser beam having a relatively low energy at an infrared wavelength. It is conceivable, therefore, to use a higher energy UV-YAG laser or excimer laser. Actually, in the case of application in fine pitches with a L/S (line/space) of (5 μm or less)/(5 μm or less) and a via hole diameter of 50 μm or less, high-energy lasers are advantageous because they have short wavelengths. If a hole is made in the metal carrier by such a high-energy laser, the high energy causes the via hole not to have a designed shape, leading to low hole diameter accuracy, resulting in low laser drilling performance. In addition, in the case of a via hole formed by laser drilling with high energy, the energy of the laser light is so strong that it penetrates the inner conductor, making it difficult to stably form a bottomed via hole. It is conceivable, therefore, to use a resin carrier instead of the metal carrier in terms of an improvement in laser drilling performance, thus mass productivity and high throughput. In this respect, as listed in Patent Document 2, various types of resin carriers are known; however, many of them are made of resins having low heat resistance, and deteriorate by heat at the time of press bonding to a base material, resulting in damage such as cracks. Further problems are as follows: the resin carrier itself has no resistance to desmear and is eluted and deformed during the desmear step. Even if the resin carrier itself is stable during the desmear process, the resin carrier is lifted up from the release layer after the desmear step.

The present inventors have now found that a carrier made of a specific resin and a release layer having a double-layer configuration composed of a silicon layer and a carbon layer can provide a copper foil with a carrier particularly suitable for a circuit forming process in which a carrier is removed after laser drilling and desmear treatment. Specifically, the present invention have been found to provide a copper foil with a carrier having high heat press resistance (heat resistance) of a carrier, laser drilling performance, corrosion resistance of a carrier during the desmear treatment, corrosion resistance of a release layer during the desmear treatment, and carrier release strength.

An object of the present invention is, therefore, to provide a copper foil with a carrier particularly suitable for a circuit forming process for removing a carrier after laser drilling and desmear treatment, in detail, a copper foil with a carrier having high heat press resistance (heat resistance) of a carrier, laser drilling performance, corrosion resistance of a carrier during the desmear treatment, corrosion resistance of a release layer during the desmear treatment, and carrier release strength.

According to an aspect of the present invention, there is provided a copper foil with a carrier comprising:
 a carrier comprising at least one resin selected from polyethylene naphthalate (PEN) resins, polyethersulfone (PES) resins, polyimide (PI) resins, and polyphenylene sulfide (PPS) resins;
 a silicon layer provided on the carrier, the silicon layer mainly containing silicon;
 a carbon layer provided on the silicon layer, the carbon layer mainly containing carbon; and
 an extremely thin copper layer provided on the carbon layer.

According to another aspect of the present invention, there is provided a resin-coated copper foil comprising:
 the above-described copper foil with a carrier and
 a resin composition layer provided on the extremely thin copper layer of the copper foil with a carrier.

According to another aspect of the present invention, there is provided a method for manufacturing printed circuit board comprising the steps of:
 laminating a resin layer and the copper foil with a carrier in sequence or laminating the resin-coated copper foil on at least one side of a core layer to form a laminate with a carrier,
 forming a via hole by laser drilling of the laminate with a carrier,
 desmear treating the laminate for removing smears from the via hole, and
 removing the carrier after the desmear treating step.

DESCRIPTION OF EMBODIMENT

Copper Foil with a Carrier

Figure 1:
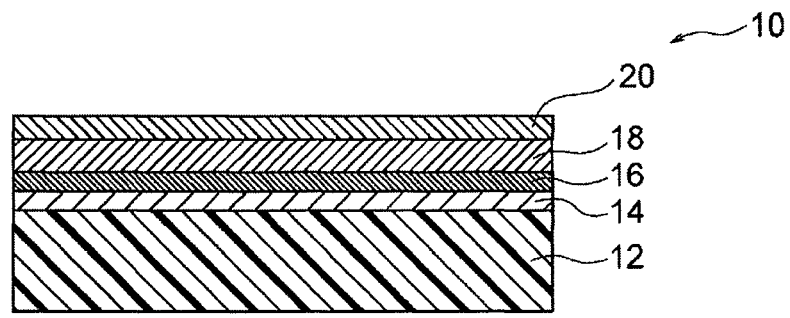
FIG. 1 is a schematic cross-sectional diagram illustrating an embodiment of a copper foil with a carrier.

The copper foil with a carrier of the present invention is schematically illustrated in FIG. 1. As shown in FIG. 1, the copper foil 10 with a carrier of the present invention comprises a carrier 12, a silicon layer 14, a carbon layer 16, and an extremely thin copper layer 18 in this order. The carrier 12 comprises at least one resin selected from polyethylene naphthalate (PEN) resins, polyethersulfone (PES) resins, polyimide (PI) resins, and polyphenylene sulfide (PPS) resins. The silicon layer 14 is provided on the carrier 12 and mainly contains silicon. The carbon layer 16 is provided on the silicon layer 14 and mainly contains carbon. The silicon layer 14 and the carbon layer 16 constitute a release layer having a double-layer configuration. The extremely thin copper layer 18 is made of copper provided on the carbon layer 16. An optional silicon-based adhesion layer 20, if necessary, may further be provided on the extremely thin copper layer 18. Furthermore, these layers may be stacked on the upper and lower surfaces of the carrier 12 to be symmetric about the carrier 12. The copper foil 10 with a carrier may have any known layer configuration with proviso that the carrier 12 is a film (hereinafter referred to as a resin film) composed of the specific resin described above and that the release layer consists of the silicon layer 14 and the carbon layer 16. Thus, a carrier made of a specific resin and a release layer having a double-layer configuration composed of a silicon layer 14 and a carbon layer 16 can provide a copper foil with a carrier 12 particularly suitable for a circuit forming process in which a carrier is removed after laser drilling and desmear treatment. Specifically, there can be provided a copper foil with a carrier 12 having high heat press resistance (heat resistance) of a carrier, laser drilling performance, corrosion resistance of a carrier during the desmear treatment, corrosion resistance of a release layer during the desmear treatment, and carrier release strength.

Figure 2:
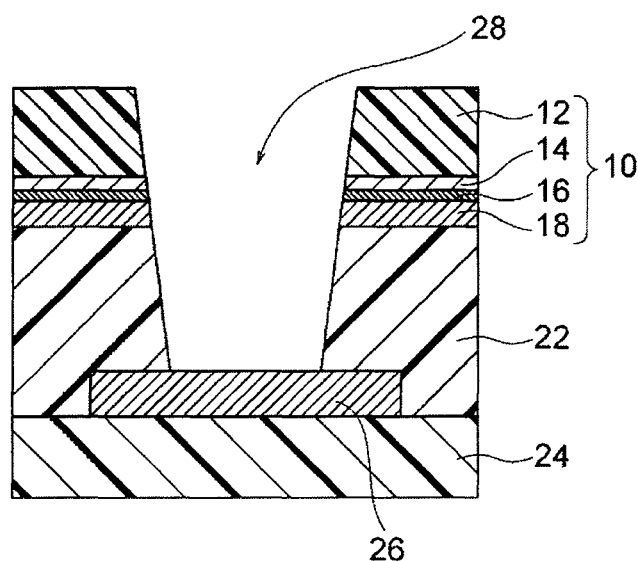
FIG. 2 is a conceptual diagram illustrating a state after laser drilling and desmear treatment of a laminate with a carrier including a copper foil with a carrier of the present invention.
Figure 6:
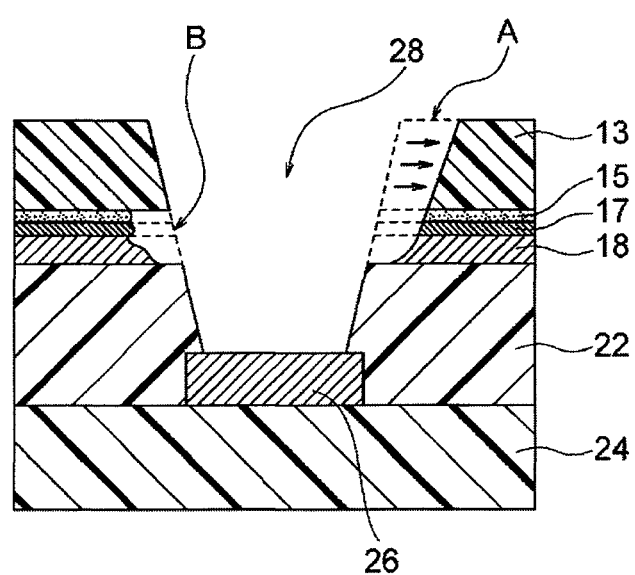
FIG. 6 is a conceptual diagram showing an exemplary undesirable state after laser drilling and desmear treatment of a laminate with a carrier including a copper foil with a carrier outside the scope of the present invention.

FIG. 2 conceptually shows a state after laser drilling and desmear treatment of the laminate with a carrier including the copper foil 10 with a carrier of the present invention. As shown in FIG. 2, in the copper foil 10 with a carrier of the present invention, the resin layer 22 and the copper foil 10 with a carrier are laminated on the core layer 24 having the inner conductor 26 on its surface, and a via hole 28 is formed by laser drilling while the carrier 12 is being attached. The desmear treatment is then performed to remove smear by putting the via hole 28 into contact with permanganate solution. Successfully performed laser drilling and desmear treatment provide satisfactory results, for example, no abnormal dissolution of each layer and no adhesion failure between different layers, as shown in FIG. 2. In contrast, FIG. 6 illustrates an exemplary undesirable state after laser drilling and desmear treatment of a laminate with a carrier including a copper foil with a carrier outside the scope of the present invention. The embodiment shown in FIG. 6 has a configuration different from that of the present invention in both the resin carrier and the release layer. The same components as those in FIG. 1 are denoted by the same reference numerals, while the carrier, the first interfacial layer, and the second interfacial layer, which are constituents different from those in FIG. 1, are denoted by different numerals 13, 15 and 17, respectively. The embodiments outside the scope of the present invention have the following two typical problems:

(i) Dissolution of carrier (refer to the part marked A in FIG. 6): If the carrier 13 is separated by dissolution or swell during the desmear step, the release layer (i.e., the first release layer 15 and the second release layer 17) at the shoulder of the via hole 28 is exposed, and the thin release layer also easily be broken to expose the extremely thin copper layer 18. Once the pretreatment step (soft etching) of the electroless copper plating is performed in this state, the extremely thin copper layer 18 disappears from the shoulder of the via hole 28. The via hole 28 free of the extremely thin copper layer 18 being the power supply layer may cause problems such as no deposition of electroplating on the via land (which forms a part of the upper wiring layer) and adhesion failure between the resin layer 22 and the extremely thin copper layer 18.

(ii) Dissolution or poor adhesion of the release layer (refer to the part marked B in FIG. 6): The release layers (the first release layer 15 and the second release layer 17) are dissolved in the desmear liquid, or separation occurs between the carrier 12 and the release layer. The penetration of the desmear liquid is observed in such a site. Thus, the surface of the extremely thin copper layer 18 is exposed during the electroless plating step. In such a state, the extremely thin copper layer 18 may disappear from the shoulder of the via hole 28 during the pretreatment step (soft etching) of electroless copper plating. The via hole 28 thus formed in a state where the extremely thin copper layer 18 as the power supply layer is missing may cause problems such as no precipitation of electroplating on the via land portion (which forms a part of the upper wiring layer) and adhesion failure between the resin layer 22 and the extremely thin copper layer 18.

In contrast, the carrier 12 of the copper foil with a carrier of the present invention comprises at least one resin selected from polyethylene naphthalate (PEN) resins, polyethersulfone (PES) resins, polyimide (PI) resins, and polyphenylene sulfide (PPS) resins and the release layer has a double-layer configuration of the silicon layer 14 and the carbon layer 16, as shown in FIG. 2. Such features solve the above-described two problems simultaneously. In other words, the features enhance both the corrosion resistance of the carrier against the desmear treatment and the corrosion resistance of the release layer against the desmear treatment. Furthermore, the carrier 12 has high heat press resistance because of the above described specific resin having high heat resistance (for example, heat resistance at 220° C., preferably 230° C., and more preferably at 260° C.) and high chemical resistance. Furthermore, since the carrier 12 is composed of resin, the laser drilling performance is remarkably superior to that of the metal carrier (i.e., the accuracy of the via hole diameter is higher). In addition, the combination of the carrier 12 made of the specific resin and the release layer having the double-layer configuration (i.e., the silicon layer 14 and the carbon layer 16) can achieve a significantly favorable carrier release strength, i.e., bare carrier release during laser drilling and desmear treatment but ready carrier release after the desmear treatment.

The carrier 12 comprises at least one resin selected from polyethylene naphthalate (PEN) resins, polyethersulfone (PES) resins, polyimide (PI) resins, and polyphenylene sulfide (PPS) resins, which have excellent heat resistance. Preferably, polyethersulfone (PES) resins, polyphenylene sulfide (PPS) resins, and combinations thereof are used in view of both heat resistance and corrosion resistance. A typical form of the carrier 12 is a film or sheet. The carrier has a thickness of preferably 10 to 100 μm, more preferably 15 to 50 μm. The carrier 12 having a thickness within such a range is easy to handle, having little thermal damage during film formation, while a via hole with high precision by laser drilling can be readily formed. At least the surface, adjacent to the extremely thin copper layer 18, of the carrier 12 preferably has an arithmetic average roughness Ra of 5 nm or more and 100 nm or less for maintaining the smoothness of the extremely thin copper layer 18, measured in accordance with JIS B 0601-2001. In the measurement of the arithmetic average roughness Ra on such a smooth surface, values measured with a non-contact type surface roughness/shape measuring instrument (such as the laser microscope) are preferably employed.

The silicon layer 14 mainly contains silicon. The silicon constituting the silicon layer 14 is typically amorphous silicon. The silicon layer 14 preferably has a silicon content of 60 atom % or more, more preferably 70 atom % or more, more preferably 80 atom % or more, particularly preferably 85 atom % or more, most preferably 90 atom % or more, measured by XPS. The upper limit of the silicon content is not limited and may be 100 atom %. The realistic silicon content is 98 atom % or less. The silicon layer may further contain carbon, oxygen, hydrogen, or a combination thereof. The silicon-based material constituting the silicon layer 14 may contain incidental impurities introduced from raw material components or during film-forming step, such as boron (B), phosphorus (P), aluminum (Al), antimony (Sb), and arsenic (As). For example, in the case that a small amount of conductive dopant, such as boron, is added to the sputtering target to enable DC sputtering, such dopant contamination may be tolerated. Furthermore, the silicon adhesion layer may contain other dopants within the scope not departing from the gist of the present invention. The presence of oxygen introduced by exposure to the atmosphere after the silicon film formation can be also tolerated. The silicon layer 14 is preferably a layer formed by vapor phase deposition such as sputtering. The silicon layer 14 is preferably formed by vapor phase deposition, such as DC sputtering, using a silicon target doped with boron. The silicon layer 14 preferably has a thickness of 1 to 50 nm, preferably 3 to 20 nm, more preferably 5 to 15 nm, and most preferably 8 to 12 nm. This thickness is a value measured by analyzing the cross section of the layer with an energy dispersive X-ray spectrometer (TEM-EDX) of a transmission electron microscope.

The carbon layer 16 mainly contains carbon, preferably is composed mainly of carbon or hydrocarbon, more preferably amorphous carbon, which is a hard carbon film. The carbon layer 16 preferably has a carbon content of 60 atom % or more, more preferably 70 atom % or more, more preferably 80 atom % or more, particularly preferably 85 atom % or more, measured by XPS. The upper limit of the carbon content is not limited and may be 100 atom %. The realistic content is 98 atom % or less. The carbon layer 16 may contain incidental impurities (for example, oxygen, carbon, and hydrogen derived from the surrounding environment such as atmosphere). Furthermore, copper atoms may be introduced into the carbon layer 16 due to the deposition technique of the extremely thin copper layer 18. Carbon has low interdiffusion and reactivity with carriers and prevents the formation of metal bonds between the copper foil layer and the joint interface due to high temperature heating even when subjected to press processing at a temperature exceeding 300° C., so that the carrier is still readily removed. Furthermore, combining the carbon layer with the silicon layer 14, when used for manufacturing printed circuit boards, contributes to an improvement in rectilinearity at the outer edge of the wiring pattern and achievement of the adequate adhesion and releasability between the extremely thin copper layer and the carrier according to manufacturing stages. This carbon layer 16 is also preferably formed by vapor phase deposition such as sputtering in view of reductions in excess impurities in the amorphous carbon and the continuous productivity with the deposition of the silicon layer 14. The thickness of the carbon layer is preferably from 0.1 to 10 nm, which is measured by analyzing the cross section of the layer with an energy dispersive X-ray spectrometer (TEM-EDX) of a transmission electron microscope.

The extremely thin copper layer 18 may be manufactured by any method, for example, a wet process, for example, electroless copper plating or electrolytic copper plating; physical vapor deposition, for example, sputtering or vacuum vapor deposition; chemical vapor deposition; or combination thereof. A particularly preferred extremely thin copper layer is manufactured by vapor phase deposition, for example, sputtering or vacuum vapor deposition because the resulting copper foil is extremely thin and is suitable to meet a fine pitch, and the most preferred is manufactured by sputtering. The extremely thin copper layer is preferably not roughened or secondarily roughened by preliminary roughing, soft etching, cleaning, or oxidation-reduction with proviso that the wiring pattern can be formed without difficulty during the production of printed circuit boards. The extremely thin copper layer can have any thickness, but, in terms of meeting the fine pitch as described above, has a thickness of preferably 50 to 2500 nm, more preferably 75 to 2000 nm, still more preferably 90 to 1500 nm, particularly preferably 100 to 1000 nm, most preferably 100 to 700 nm or 150 to 800 nm or 200 to 1000 nm. The extremely thin copper layer having such a thickness within this range is preferably manufactured by sputtering from the viewpoint of uniformity of in-plane thickness of layer and productivity in sheet form or roll form.

The extremely thin copper layer 18 has a surface remote from the carbon layer 16 (the surface adjacent to the silicon-based adhesion layer 20), and the surface has an arithmetic average roughness Ra of 0.2 to 100 nm, more preferably from 1.0 to 50 nm, still more preferably from 3.0 to 35 nm, particularly preferably from 4.0 to 30 nm, most preferably from 5.0 to 25 nm, measured in accordance with JIS B 0601-2001. Such a copper foil 10 with a carrier having a smaller arithmetic average roughness is suitable for forming a highly miniaturized wiring pattern having such a fine line/space (L/S) of (13 µm or less)/(13 µm or less) (e.g., 12 µm/12 µm to 1 µm/1 µm) in the printed circuit board. The arithmetic average roughness Ra on such a smooth surface is preferably measured with a non-contact surface roughness/shape measuring instrument (e.g., laser microscope).

An optional silicon-based adhesion layer 20 may be further provided on the extremely thin copper layer 18. The silicon-based adhesion layer 20 contains silicon, and preferably mainly contains silicon. The silicon in the silicon-based adhesion layer 20 is typically amorphous silicon. The silicon-based adhesion layer 20 preferably has a silicon content of 60 to 98 atom %, a carbon content of 1.0 to 35.0 atom % and an oxygen content of 1.0 to 40.0 atom %, measured by XPS. The silicon-based adhesion layer 20 having the above carbon content and/or the above oxygen content formed on at least one surface of the copper foil can achieve high adhesion strength to a resin layer even if the copper foil has an extremely smooth surface such as one formed by vapor deposition, for example, sputtering. Furthermore, the silicon-based adhesion layer 20 having the above composition can achieve a desirable insulation resistance suitable for a fine pitch in a printed circuit board to prevent or reduce the leakage current among interconnections in the fine-pitched wiring pattern. Carbon atoms and oxygen atoms in the silicon adhesion layer are typically bonded to silicon atoms. Incorporation of such amounts of carbon and hydrogen into the silicon adhesion layer achieves both the adhesion to the resin layer and the insulating resistance. Furthermore, a silicon-based material constituting the silicon adhesion layer may contain incidental impurities introduced from raw material components or during film-forming step. For example, addition of a small amount of a conductive dopant such as boron to a DC sputtering target may involves mixing of a trace amount of such a dopant into the silicon adhesion layer. Such incidental impurities contamination can be tolerated. Furthermore, the silicon adhesion layer may contain other dopants within the scope not departing from the gist of the present invention. The presence of oxygen introduced by exposure to the atmosphere after the silicon film formation can be also tolerated.

The silicon-based adhesion layer 20 has a carbon content of preferably 1.0 to 35.0 atom %, more preferably 5.0 to 34.0 atom %, particularly preferably 10.0 to 30.0 atom %, and most preferably 12.0 to 30.0 atom %, measured with an X-ray photoelectron spectroscopic (XPS) system. The silicon-based adhesion layer has an oxygen content of preferably 12.0 to 40.0 atom %, more preferably 15.0 to 35.0 atom %, more preferably 20 to 30.0 atom %, and most preferably from 22.0 to 28.0 atom %, measured with an X-ray photoelectron spectroscopic (XPS) system. The carbon content and the oxygen content within the above ranges can significantly improve the adhesion to the resin layer and the insulation resistance. Although its mechanism is not certain, the oxygen atoms present in the silicon adhesion layer contributes to the insulation resistance. An excess number of oxygen atoms may however decrease the adhesion of the silicon adhesion layer to the resin layer. Carbon atoms moderately present in the silicon adhesion layer also contribute to improvements in adhesion and insulation resistance.

Throughout the specification, the silicon content, carbon content, and oxygen content of the silicon layer 14, the carbon layer 16, and the silicon-based adhesion layer 20 are measured with an X-ray photoelectron spectroscopic (XPS) system. Measurement by XPS can be performed from the silicon layer 14, the carbon layer 16, or the silicon-based adhesion layer 20 immediately after the deposition. Furthermore, in the case of a copper foil with a carrier or a laminate with a carrier, a printed circuit board or an electronic component manufactured using the copper foil with a carrier, the measurement of the content and the confirmation of the bonding state can be performed by exposing the silicon layer 14, the carbon layer 16 or the silicon-based adhesion layer 20 by any treatment.

The silicon-based adhesion layer 20 preferably has a thickness of 0.1 to 100 nm, more preferably 2 to 100 nm, still more preferably 2 to 20 nm, particularly preferably 4 to 10 nm. The silicon base adhesion layer 20 having a thickness within such a range can significantly improve adhesion to the resin layer and insulation resistance. The thickness is measured by analyzing the cross section of the layer with an energy dispersive X-ray spectrometer (TEM-EDX) of a transmission electron microscope.

Method for Manufacturing Copper Foil with Carrier

The copper foil 10 with a carrier according to the present invention can be manufactured by preparing a carrier 12 and forming a silicon layer 14, a carbon layer 16, an extremely thin copper layer 18 and an optional silicon-based adhesion layer 20 on one side or both sides of the carrier 12. The carrier 12 may be surface-treated prior to deposition of, for example, the silicon layer 14. Examples of the surface treatment step include corona treatment, plasma treatment, and UV ozone treatment that are carried out typically for the purpose of removal of foreign matter and activation of the surface to such an extent that the surface roughness is not increased. The silicon layer 14, the carbon layer 16, the extremely thin copper layer 18, and the optional silicon-based adhesion layer 20 are preferably formed by vapor phase deposition to readily meet the fine pitch achieved by extremely thin film. Examples of the vapor phase deposition include sputtering, vacuum vapor deposition, and ion plating, most preferably sputtering from the viewpoint of controlling the film thickness over a wide range of 0.05 nm to 5000 nm and maintaining the uniform film thickness over a wide width or wide area. In particular, forming all of the silicon layer 14, the carbon layer 16, the extremely thin copper layer 18, and the optional silicon-based adhesion layer 20 provided by sputtering allows the production efficiency to increase remarkably. The vapor phase deposition may be carried out under any known condition using any known vapor deposition system. For example, if sputtering is used, then any of various known sputtering techniques such as magnetron sputtering and bipolar sputtering can be used. Magnetron sputtering is preferred in view of high deposition rate and high productivity. Sputtering can be performed with a direct current (DC) supply or radio frequency (RF) supply.

Hereinafter, vapor phase deposition (preferably sputtering) of each of the silicon layer 14, the carbon layer 16, the extremely thin copper layer 18, and the silicon-based adhesion layer 20 will be described.

It is preferred that the vapor phase deposition of the silicon layer 14 be carried out, as necessary, with at least one additive component containing a carbon source and a hydrogen source using a silicon target and/or silicon carbide target under a non-oxidizing atmosphere. In this case, it is preferred that the additive component include at least one gas selected from the group consisting of methane, ethane, propane, butane, acetylene, and tetraethoxysilane. These materials are advantageous because each of these can serve as both a carbon source and a hydrogen source. The purity of the silicon target is preferably 99.9% or more. It is preferred, however, to use a silicon target doped with a conductive dopant in the case of performing DC sputtering because the bulk resistance of the silicon target is desirably lowered, for example, to 0.01 Ω·cm or less to improve film formation efficiency. Examples of the conductive dopant include preferably boron (B), phosphorus (P), aluminum (Al), antimony (Sb), arsenic (As) and combinations thereof, most preferably boron (B). In the case where the silicon target is doped with a conductive dopant, such as boron, the amount of the conductive dopant is preferably 0.01 ppm to 500 ppm, more preferably 0.01 ppm to 300 ppm. Furthermore, the ultimate vacuum within the chamber before the start of sputtering is preferably less than $1 \times 10^{-4}$ Pa. The gas used for sputtering is preferably a mixture of an inert gas, such as argon, and raw material gases of the additive components (preferably methane, ethane, propane, butane, acetylene, tetraethoxysilane or any combinations thereof). The most preferable gas is a combination of argon and methane. Argon can be supplied at any flow rate, which may be determined as appropriate according to dimensions of the sputtering chamber and deposition conditions. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

The film vapor deposition of the carbon layer 16 by the vapor phase deposition (preferably sputtering) is preferably carried out in an inert atmosphere, such as argon, using a carbon target. The carbon target is preferably composed of graphite, but may contain incident impurities (e.g., oxygen or carbon from the surrounding environment such as atmosphere). The purity of the carbon target is preferably 99.99% or more, more preferably 99.999% or more. Furthermore, the pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

The film vapor deposition of the extremely thin copper layer 18 by vapor-phase method (preferably sputtering) is preferably performed in an inert atmosphere such as argon using a copper target. The copper target is preferably composed of metallic copper, but may contain incidental impurities. The copper target has a purity of preferably 99.9% or more, more preferably 99.99%, still more preferably 99.999% or more. The temperature of the extremely thin copper layer 18 during film vapor deposition is preferably 50° C. or less, more preferably 40° C. or less, still more preferably 30° C. or less, particularly preferably 25° C. or less. Deposition by sputtering can involve carousel method or a roll-to-roll method. The temperature of a stage for supporting a sample or a can roll, around which a sample is wound during deposition, can be controlled at a predetermined temperature. A forced cooling mechanism is required because the sample temperature may reach 100° C. or higher during the Ar plasma during deposition. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

It is preferred that the film vapor deposition of the silicon-based adhesion layer 20 be carried out with at least one additive component containing a carbon source and a hydrogen source using a silicon target and/or silicon carbide target under a non-oxidizing atmosphere. In this case, it is preferred that the additive component include at least one gas selected from the group consisting of methane, ethane, propane, butane, acetylene, and tetraethoxysilane. These materials are advantageous because each of these can serve as both a carbon source and a hydrogen source. Although, the silicon target preferably has a purity of 99.9% or more, DC sputtering preferably uses a silicon target doped with a conductive dopant to reduce the bulk resistance of the silicon target, for example, to 0.01 Ω·cm or less and to improve the deposition efficiency. Examples of the conductive dopant include preferably boron (B), phosphorus (P), aluminum (Al), antimony (Sb), arsenic (As) and combinations thereof, most preferably boron (B). In the case where the silicon target is doped with a conductive dopant, such as boron, the amount of the conductive dopant is preferably 0.01 ppm to 500 ppm, more preferably 0.01 ppm to 300 ppm. Furthermore, the ultimate vacuum within the chamber before the start of sputtering is preferably less than $1 \times 10^{-4}$ Pa. The gas used for sputtering is preferably a mixture of an inert gas such as argon and raw material gas of the additive components (preferably methane, ethane, propane, butane, acetylene, tetraethoxysilane or any combination thereof). The most preferable gas is a combination of argon and methane. The most preferable gas is a combination of argon and methane. Argon can be supplied at any flow rate, which may be determined as appropriate according to dimensions of the sputtering chamber and deposition conditions. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

The copper foil with a carrier according to the present invention may be provided in the form of a resin-coated copper foil. In this case, the resin-coated copper foil of the present invention includes the copper foil with a carrier of the present invention and a resin composition layer provided on the extremely thin copper layer of the copper foil with a carrier. The resin composition layer may be composed of any resin commonly used in resin-coated copper foils. The resin composition layer may be a resin layer commonly used in known resin-coated copper foils, and may be constructed in the same manner as the resin layer 22 described later with respect to production of the printed circuit board.

Production of Printed Circuit Board

Figure 3:
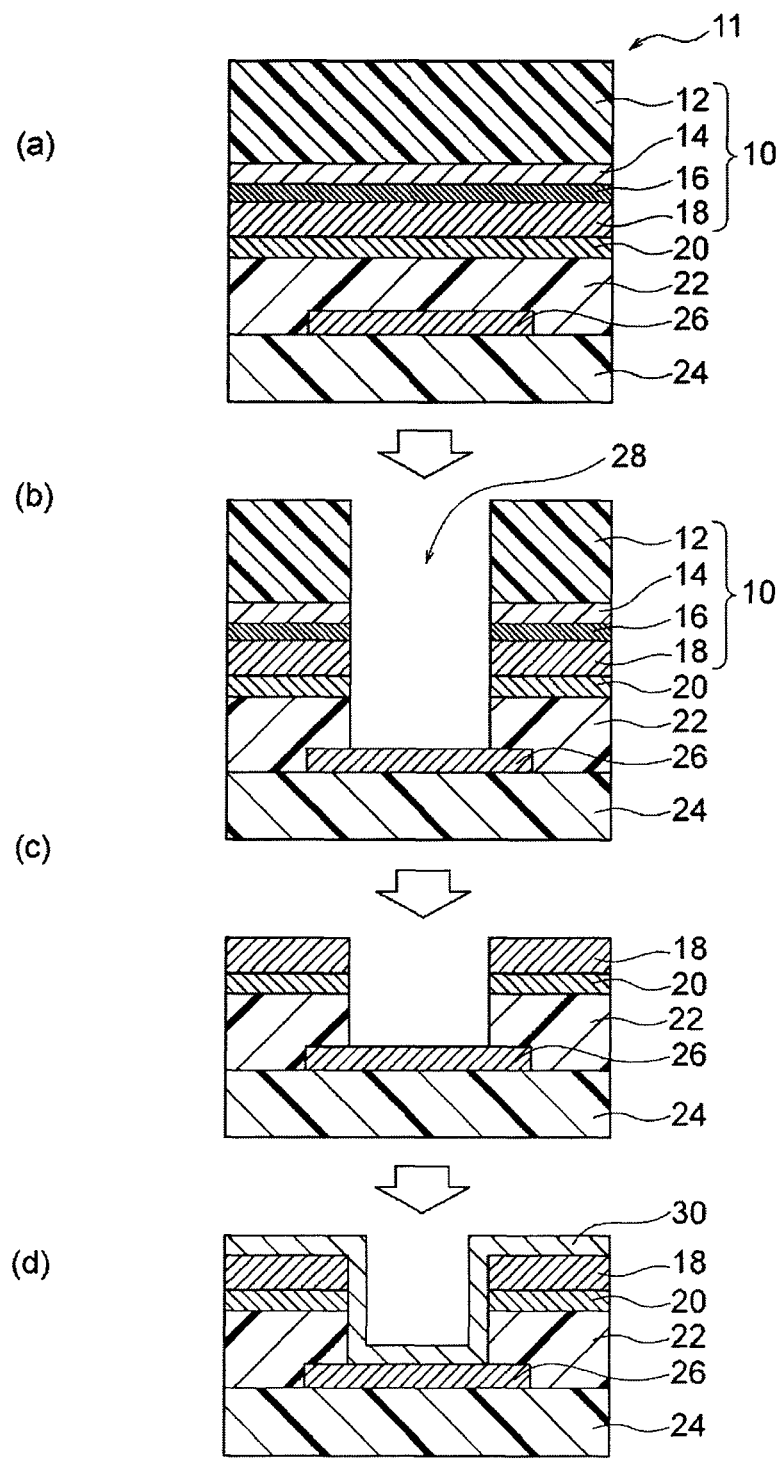
FIG. 3 is a diagram illustrating a method for manufacturing a printed circuit board of the present invention.

A printed circuit board can be manufactured using the copper foil with a carrier of the present invention. Hereinafter, a preferred method of manufacturing the printed wiring board will be described. The method of manufacturing the printed wiring board includes (1) a step of forming a laminate with a carrier, (2) a step of laser drilling, (3) a step of desmear treatment, and (4) a step of removing a carrier. FIG. 3 schematically illustrates part of the method of manufacturing the printed circuit board according to these steps.

(1) Step of Forming a Laminate with a Carrier

The resin layer 22 and then the copper foil 10 with a carrier according to the present invention are laminated on at least one side of a core layer (not shown), or the resin-coated copper foil of the present invention is laminated on the core layer. A laminate 11 with a carrier is thereby produced. The core layer has the following two forms in this embodiment:

(i) The first form: the core layer is used as a surface layer of build-up layers having one or more bottomed via holes. An example of the core layer in this case is a laminated board having a patterned inner conductor 26 on its surface and a coreless support having an unpatterned inner conductor 26 on its surface.

(ii) The second form: the core layer is used in a single-sided or double-sided copper-clad laminate. Examples of the core layer in this case include prepregs impregnated with fiber reinforcement (glass cloth), heat-resistant resin films, resin plates, and glass plates. In any case, as shown in FIG. 3, the core layer and the resin layer 22 are preferably positioned adjacent to the extremely thin copper layer 18 (adjacent to the silicon-based adhesion layer 20, if present) of the copper foil 10 with a carrier of the present invention.

The resin layer 22 is composed of a resin, preferably an insulating resin. The resin layer is preferably in the form of a prepreg and/or a resin sheet. "Prepreg" is a general term for a composite material of substrates, such as synthetic resin plates, glass plates, woven glass fabrics, nonwoven glass fabrics, and paper, which are impregnated with synthetic resins. Preferred examples of the insulating resin include epoxy resins, cyanate resins, bismaleimide triazine (BT) resins, polyphenylene ether resins, phenolic resins, tetrafluoroethylene resins, and fluorine resins. Examples of the insulating resin in the resin sheet include insulating resins such as epoxy resins, polyimide resins, and polyester resins. Furthermore, the resin layer 22 may contain various inorganic fillers, such as silica and alumina to enhance insulating properties.

(2) Step of Laser Drilling

Laser drilling is performed on the laminate with a carrier to form a via hole 28. If the core layer has an inner conductor 26 is laser-drilled, the laminate with a carrier may be perforated until the inner conductor 26 is exposed to form a via bottom. Alternatively, perforation may be performed through the core layer by laser drilling to form a through hole. In any case, laser drilling may be performed with a commercially available laser drilling machine. Any type of laser can be used. Preferred examples of usable lasers include carbon dioxide gas lasers, UV-YAG lasers, and excimer lasers. In particular, in the present invention, the carrier 12, which is made of resin, allows the use of a laser with a relatively low energy, such as a carbon dioxide gas laser, unlike the case of a metal carrier. It is also preferable to use a higher energy UV-YAG laser or excimer laser. Such a high-energy laser has a short wave length, and thus is particularly suitable for fine pitch applications involving (line/pace) L/S of (5 μm or less)/(5 μm or less) and a via hole diameter of 50 μm or less. In any case, the copper foil with a carrier of the present invention has high laser drilling performance and can form a via hole with extremely high accuracy.

(3) Step of Desmear Treatment

Desmear treatment is then performed on the via hole 28 to remove smear. This step is well known in the art as desmear treatment using a desmear solution and may include putting the via hole 28 into contact with the desmear solution, such as a permanganate solution or a chromate solution. The desmear solution is preferably a permanganate solution, which can efficiently remove the smear and minimize the erosion of the carrier 12. Before treatment with the desmear solution, swelling treatment may be carried out with, for example, an organic solvent or a mixed solution of an organic solvent and alkali to promote the removal of the smear. After the treatment with the desmear solution, a reduction treatment with a neutralizing/reducing agent may be performed to remove residual permanganate. In the method of the present invention, as shown in FIG. 2, the carrier 12 of the copper foil comprises at least one resin selected from polyethylene naphthalate (PEN) resins, polyethersulfone (PES) resins, polyimide (PI) resins, and polyphenylene sulfide (PPS) resins and the release layer has a double-layer configuration of the silicon layer 14 and the carbon layer 16. Such features solve the two problems simultaneously, i.e., (i) the dissolution of the carrier and (ii) dissolution or poor adhesion of the interfacial layer. In other words, the features enhance both the corrosion resistance of the carrier against the desmear treatment and the corrosion resistance of the release layer against the desmear treatment.

(4) Step of Removing Carrier

After the step of desmear treatment, the carrier 12 is removed. Removal of the carrier 12 may be carried out, for example, mechanically. The combination of the carrier 12 made of the specific resin and the release layer having the double-layer configuration (i.e., the silicon layer 14 and the carbon layer 16) can achieve a significantly favorable carrier release strength, i.e., bare carrier release during laser drilling and desmear treatment but ready carrier release after the desmear treatment.

(5) Other Steps

Figure 4:
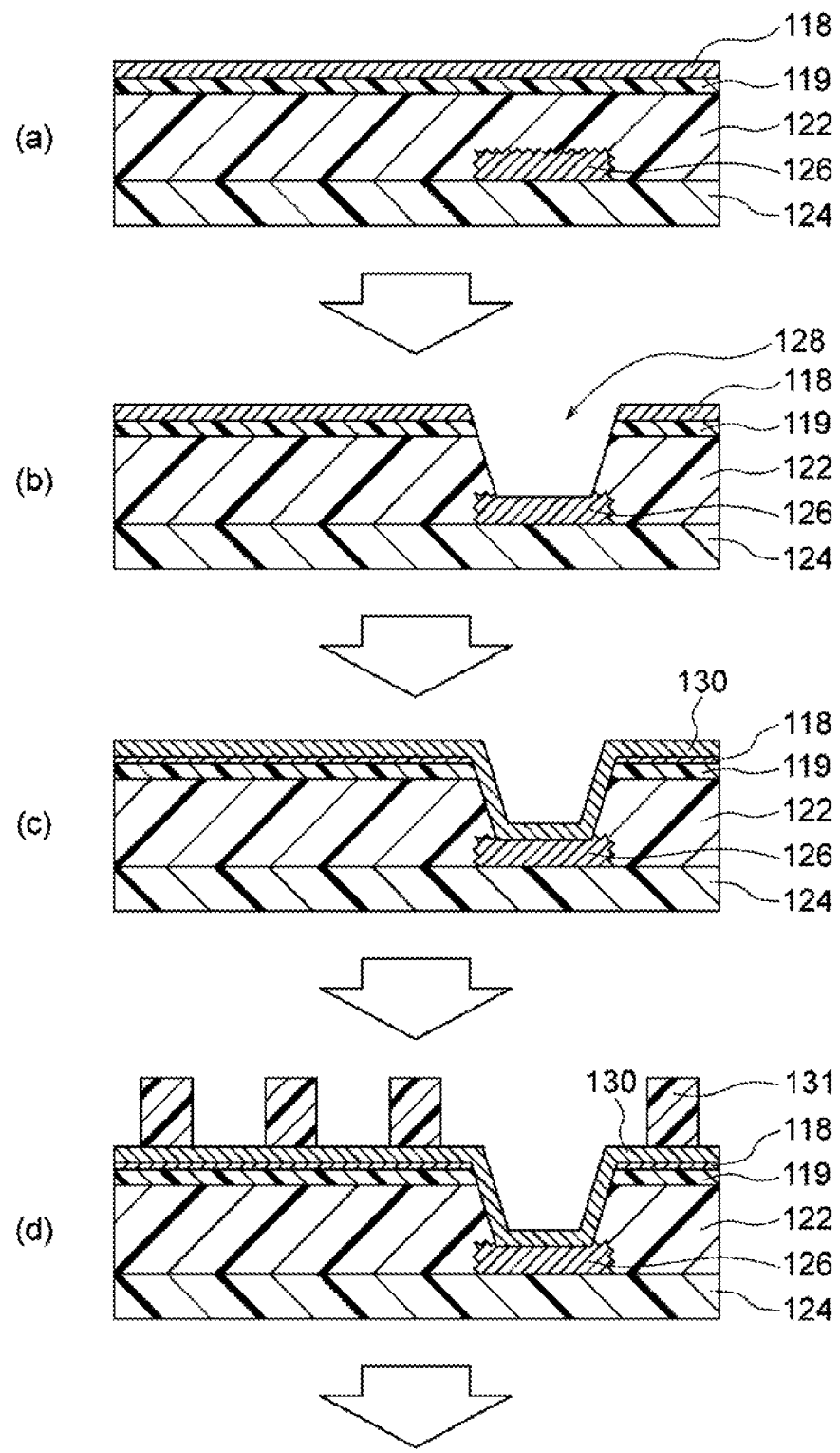
FIG. 4 is a process flow chart for explaining a conventional MSAP, showing steps in the first half (steps (a) to (d)).
Figure 5:
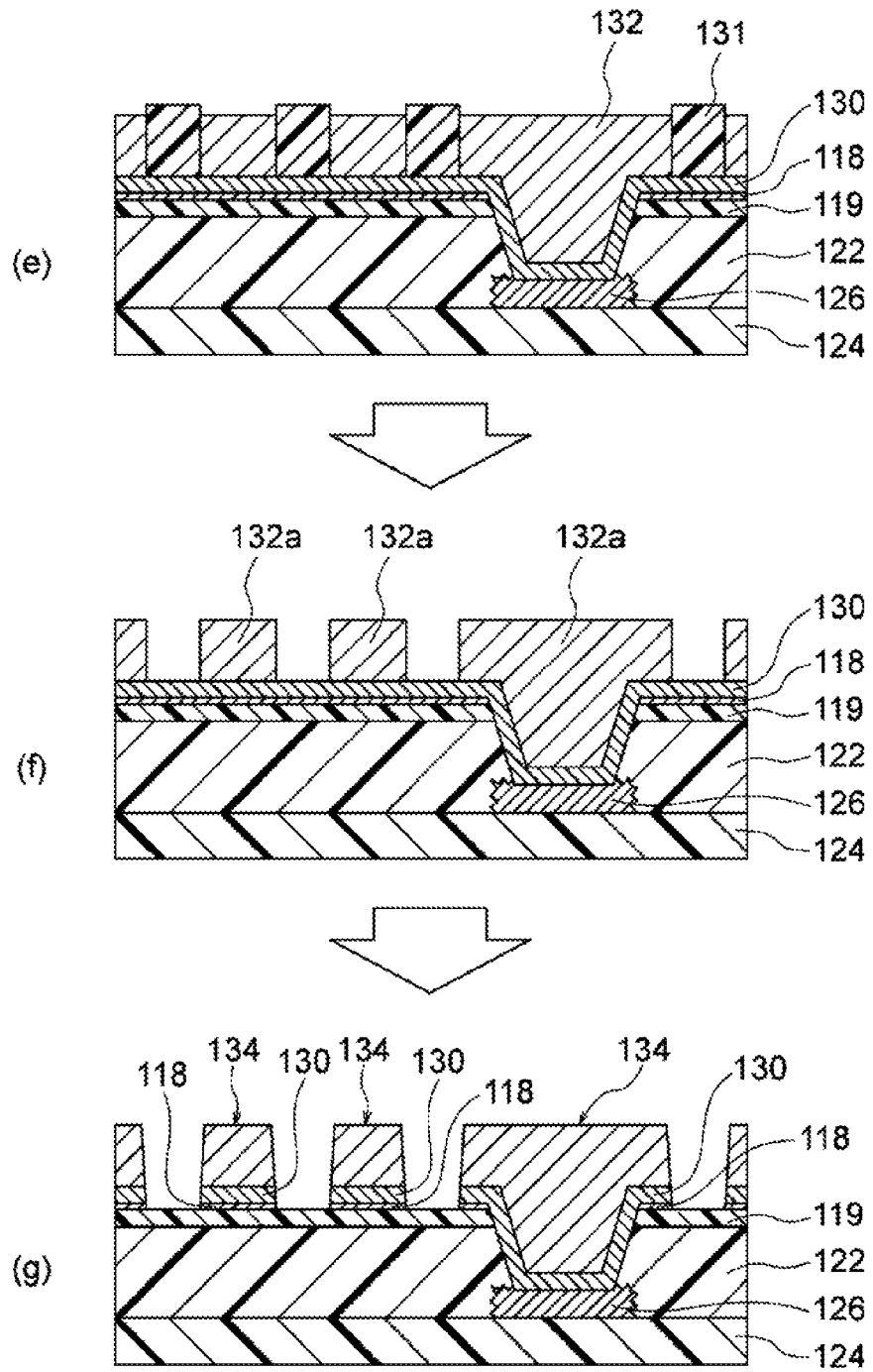
FIG. 5 is a process flow chart for explaining a conventional MSAP method, showing steps in the second half (steps (e) to (g)).

As shown in FIG. 3, an electroless copper plating 30 may be formed on the laminate from which the carrier 12 has been removed. The electroless copper plating, however, may be performed between the step of desmear treatment and the step of carrier removal, or, as shown in FIG. 3, after the step of carrier removal. After the electroless copper plating, wiring processing according to a known technique can be performed to prepare a printed circuit board. The printed circuit board is manufactured by the MSAP method suitable for ultrafine wiring pattern. As shown in FIGS. 4 and 5, the manufacturing of a printed circuit board by the MSAP method involves the formation of the photoresist 131 (step (d)), the electrolytic copper plating 132 (step (e)), the removal of the photoresist 131 (step (f)), and the formation of the wiring 134 (step (g)) by removing the extremely thin copper layer 118 between the fine wiring patterns 132a by flash etching. The copper foil with a carrier of the present invention is suitable for forming a highly miniaturized wiring pattern having such a fine line/space (L/S) of (13 μm or less)/(13 μm or less) (e.g., 12 μm/12 μm, 10 μm/10 μm, 5 μm/5 μm, 2 μm/2 μm, 1 μm/1 μm).

The printed circuit board can have any known layer configuration, except for the extremely thin copper layer 18 of the copper foil 10 with a carrier of the present invention. Specific examples of the printed circuit board include a single-sided or double-sided printed wiring board formed in such a manner that the extremely thin copper layer 18 of the copper foil 10 with a carrier of the present invention is bonded to one or two surfaces of the prepreg and cured into a laminate (CCL) to form a circuit; and multi-layered printed circuit board that are composed of these printed wiring boards. Other specific examples include a flexible printed wiring board, a COF, and a TAB tape, which are formed in such a manner that the extremely thin copper layer 18 of the copper foil 10 with a carrier of the present invention is formed on the resin film to from a circuit. Still other specific examples include a build-up wiring board and a direct-buildup-on-wafer. The build-up wiring board is formed in a manner described below. The above-described resin layer is applied on the copper foil with a carrier of the present invention to form a resin-coated copper foil (RCC), which is laminated to the above-described printed board using the resin layer as an insulating bonding layer to form a circuit using the extremely thin copper layer as a whole or a part of the wiring layer by a technique such as a semi-additive process (SAP), modified semi-additive process (MSAP), or subtractive process. The direct-buildup-on-wafer is formed in such a manner that lamination of the resin-coated copper foil on a semiconductor integrated circuit and formation of the circuit are alternately repeated. More advanced specific examples include an antenna element formed in such a manner that the above-described resin-coated copper foil is laminated on a substrate to form a circuit; electronic material for a panel display or window glass formed in such a manner that the resin-coated copper foil is laminated on a glass sheet or a resin film through a bonding layer to form a circuit; and electromagnetic wave shielding film composed of the extremely thin copper layer 18 of the copper foil 10 with a carrier of the present invention coated with a conductive bonding agent.

The present invention will be described in further detail by way of the following examples.

EXAMPLE 1

(1) Preparation of Copper Foil with Carrier

As shown in FIG. 1, a silicon layer 14, a carbon layer 16, an extremely thin copper layer 18, and a silicon-based adhesion layer 20 were deposited in this order on a resin-film carrier 12 to prepare a copper foil 10 with a carrier. The detailed procedures are as follows. The arithmetic average roughness Ra referred to in the following examples is measured with a non-contact profilometer (NewView 5032 available from Zygo Corporation) in accordance with JIS B 0601-2001.

(1a) Preparation of Carrier

A polyethylene naphthalate (PEN) film (product name: Q 51, available from Teijin DuPont Films Japan Limited) having a surface with an arithmetic average roughness Ra of 1.8 nm and a thickness of 38 μm was prepared.

(1 b) Formation of Silicon Layer

A silicon layer 14 having a thickness of 10 nm was deposited on the surface of the carrier 12 by sputtering under the following conditions:

Apparatus: self-propelled sputtering apparatus (available from Hirano Kohon, Ltd.)

Target: Silicon target having dimensions of 280 mm by 1580 mm and a thickness of 6 mm doped with 200 ppm boron Ultimate vacuum Pu: less than $5 \times 10^{-4}$ Pa Gas: Argon (flow rate: 500 sccm)

Sputtering pressure: 0.45 Pa

Sputtering power: 10 kW (2.3 W/cm$^2$)

Transport rate: 4 m/min (1c) Formation of Carbon Layer

A carbon layer 16 composed of amorphous carbon having a thickness of 2.7 nm was deposited on the silicon layer 14 by sputtering under the following conditions:

Apparatus: self-propelled sputtering apparatus (available from Hirano Kohon, Ltd.)

Target: carbon target having dimensions of 280 mm by 1580 mm and a thickness of 6 mm (purity 99.99%)

Carrier Gas: Argon (flow rate: 500 sccm)

Ultimate vacuum (Pu): less than $5 \times 10^{-4}$ Pa

Sputtering pressure (PAr): 0.45 Pa

Sputtering power: 6 kW
Transport rate: 4 m/min
(1d) Formation of Extremely Thin Copper Layer An extremely thin copper layer 18 having a thickness of 0.3 μm was deposited on the carbon layer 16 by sputtering under the following conditions. The extremely thin copper layer 18 has a surface remote from the carbon layer 16 (i.e., the outer surface), and the surface has an arithmetic average roughness Ra of 5.2 nm.

Apparatus: self-propelled sputtering apparatus (available from Hirano Kohon, Ltd.)
Target: copper target having dimensions of 280 mm by 1580 mm and a thickness of 10 mm (purity 99.98%)
Ultimate vacuum Pu: less than $5 \times 10^{-4}$ Pa
Gas: Argon (flow rate: 500 sccm)
Sputtering pressure: 0.45 Pa
Sputtering power: 20 kW (4.5 W/cm$^2$)
Transport rate: 0.4 m/min
(1e) Formation of Silicon-Based Adhesion Layer A silicon layer having a thickness of 6 nm as the silicon-based adhesion layer 20 was deposited on the extremely thin copper layer 18 by sputtering under the following conditions to prepare a copper foil with a carrier.

Apparatus: self-propelled sputtering apparatus (available from Hirano Kohon, Ltd.)
Target: silicon target having dimensions of 280 mm by 1580 mm and a thickness of 6 mm doped with 200 ppm boron
Ultimate vacuum Pu: less than $5 \times 10^{-4}$ Pa
Gas: Argon (flow rate: 500 sccm)
Methane (flow rate: 5.0 sccm)
Carbon dioxide (flow rate: 0.5 sccm)
Sputtering pressure: 0.45 Pa
Sputtering power: 3 kW (0.67 W/cm$^2$)
Transport rate: 0.4 m/min
(1f) Compositional Analysis The composition of the silicon layer 14, the carbon layer 16 and the silicon-based adhesion layer 20 was analyzed by X-ray photoelectron spectroscopy (XPS). The XPS compositional analysis was performed with an X-ray photoelectron spectroscopic (XPS) system (Quantum 2000, available from ULVAC-PHI, Inc.) under the following condition for survey measurement: Output: 40 W, X-ray source: Al (using monochromator), X-ray beam diameter: 200 μm, energy range: 0 to 1400 eV, pass energy: 58.7 eV, step: 1.0 eV, measurement set time: 5 min. The content of the target element was determined from the observed survey spectrum by software of the relative sensitivity coefficient method. The XPS thereby determined the contents of silicon, carbon, and other atoms (atom %).

For the convenience of the measurement, the compositional analysis of the silicon layer 14 and the carbon layer 16 was carried out as follows: a shielding plate was installed in the apparatus to deposit only the silicon layer 14 on the film substrate under the same conditions as in step (1b) or only the carbon layer 16 on the film substrate under the same conditions as in step (1c), and the compositional analysis was performed on each surface. Each composition of the silicon layer 14 and the carbon layer 16 in the actually multilayered copper foil with a carrier was thus determined. The compositional analysis of the silicon-based adhesion layer 20 was performed on the surface of the final copper foil with a carrier prepared in step (1e).

As a result, the silicon layer 14 had a silicon content of 96 atom %, and the carbon layer 16 had a carbon content of 86 atom %. The silicon-based adhesion layer 20 had a silicon content of 72.6 atom %, a carbon content of 12.4 atom %, and an oxygen content of 15.0 atom %.

EXAMPLE 2

A copper foil with a carrier was prepared and evaluated as in Example 1 except that i) a carrier 12 of polyethersulfone (PES) (product name: SUMIKAEXCEL, available from Sumitomo Chemical Co., Ltd.) having a surface with an arithmetic average roughness Ra of 2.5 nm was used and ii) the carbon layer 16 had a thickness set to 3.0 nm. The results are shown in Table 1. The extremely thin copper layer 18 has a surface remote from the carbon layer 16, and the surface has an arithmetic average roughness Ra of 6.3 nm. The silicon layer 14, the carbon layer 16, and the silicon-based adhesion layer 20 have very similar compositions as those in Example 1.

EXAMPLE 3 (COMPARATIVE)

A copper foil with a carrier was prepared and evaluated as in Example 1 except that an aluminum layer was formed in the following manner instead of the silicon layer 14. The results are shown in Table 1. The extremely thin copper layer has a surface remote from the carbon layer, and the surface has an arithmetic average roughness Ra of 4.6 nm. The carbon layer 16 and the silicon-based adhesion layer 20 have very similar compositions as those in Example 1.

(Formation of Aluminum Layer)
An aluminum layer having a thickness of 7.0 nm was formed on the surface of the carrier 12 by DC sputtering under the following conditions:
Apparatus: self-propelled sputtering apparatus (available from Hirano Kohon, Ltd.)
Target: aluminum target having dimensions of 280 mm by 1580 mm and a thickness of 6 mm (purity 99.99%)
Carrier gas: Argon (flow rate: 500 sccm)
Sputtering pressure: 0.45 Pa
Sputtering power: 1.8 W/cm$^2$

EXAMPLE 4

A copper foil with a carrier was prepared and evaluated as in Example 1 except that a carrier 12 of a polyphenylene sulfide (PPS) film (product name: Trelina, available from Toray Industries, Inc.) having a surface with an arithmetic average roughness Ra of 7.5 nm was used. The results are shown in Table 1. The extremely thin copper layer 18 has a surface remote from the carbon layer 16, and the surface has an arithmetic average roughness Ra of 10.3 nm. The silicon layer 14, the carbon layer 16, and the silicon-based adhesion layer 20 have very similar compositions as those in Example 1.

EXAMPLE 5 (COMPARATIVE)

A copper foil with a carrier was prepared and evaluated as in Example 1 except that i) a carrier 12 of the electrodeposited copper foil prepared in the following manner was used and ii) a titanium layer was formed in the following manner instead of the silicon layer 14. The extremely thin copper layer 18 has a surface remote from the carbon layer 16, and the surface has an arithmetic average roughness Ra of 61.7 nm. The carbon layer 16 and the silicon-based adhesion layer 20 have very similar compositions as those in Example 1, respectively.

(Preparation of Career)

An electrodeposited copper foil having a thickness of 18 μm and having a glossy surface with an arithmetic average roughness Ra of 60 to 70 nm (available from Mitsui Mining & Smelting Co., Ltd.) was prepared as a carrier foil 12. The carrier was pickled. The pickling was performed by immersing the carrier in a diluted sulfuric acid solution having a sulfuric acid concentration of 150 g/l at a temperature of 30° C. for 30 sec to remove the surface oxide layer, followed by rinsing the carrier with water and drying it.

(Formation of Titanium Layer)

A titanium layer having a thickness of 6.0 nm was deposited on the glossy side of the carrier (electrodeposited copper foil) after pickling treatment by sputtering under the following conditions:

Apparatus: self-propelled sputtering apparatus (available from Hirano Kohon, Ltd.)

Target: titanium target having dimensions of 280 mm by 1580 mm and a thickness of 6 mm (purity 99.96%)

Carrier gas: Argon (flow rate: 500 sccm)

Sputtering pressure: 0.45 Pa

Sputtering rate: 1.8 W/cm$^2$

EXAMPLE 6 (COMPARATIVE)

A copper foil with a carrier was prepared and evaluated as in Example 1 except that a carrier 12 of a polyethylene terephthalate (PET) film having a thickness of 50 μm and having a surface with an arithmetic average roughness Ra of 1.7 nm (product name: Lumirror, available from Toray Industries, Inc.) was used. The results are shown in Table 1. The extremely thin copper layer 18 has a surface remote from the carbon layer 16, and the surface has an arithmetic average roughness Ra of 5.8 nm. The silicon layer 14, the carbon layer 16, and the silicon-based adhesion layer 20 have very similar compositions as those in Example 1, respectively.

EXAMPLE 7 (COMPARATIVE)

A copper foil with a carrier was prepared and evaluated as in Example 1 except that i) a titanium layer having a thickness of 6.0 nm instead of the silicon layer 14 was formed in the same manner as in Example 5, and ii) the carbon layer 16 had a thickness set to 0.5 nm. The results are shown in Table 1. The extremely thin copper layer 18 has a surface remote from the carbon layer, and the surface has an arithmetic average roughness Ra of 4.5 nm. The carbon layer 16 and the silicon-based adhesion layer 20 have very similar compositions as those in Example 1.

EXAMPLE 8 (COMPARATIVE)

A copper foil with a carrier was prepared and evaluated as in Example 1 except that i) a carrier 12 of a polyethersulfone (PES) film having a thickness of 38 μm and having a surface with an arithmetic average roughness Ra of 3.7 nm, ii) a titanium layer having a thickness of 6.0 nm instead of the silicon layer 14 was formed as in Example 5, and iii) the carbon layer 16 had a thickness set to 5.0 nm. The results are shown in Table 1. The extremely thin copper layer 18 has a surface remote from the carbon layer 16, and the surface has an arithmetic average roughness Ra of 8.5 nm. The carbon layer 16 and the silicon based adhesion layer 20 have very similar as in Example 1.

EXAMPLE 9

A copper foil with a carrier was prepared and evaluated as in Example 1 except that the carrier 12 of a polyimide (PI) film (product name: Upilex-S, available from Ube Industries, Ltd.) having a thickness of 35 μm and having a surface with an arithmetic average roughness Ra of 3.8 nm was used after corona treatment on the surface to be deposited. The results are shown in Table 1. The extremely thin copper layer 18 has a surface remote from the carbon layer 16, and the surface has an arithmetic average roughness Ra of 6.9 nm. The silicon layer 14, the carbon layer 16, and the silicon-based adhesion layer 20 have very similar composition as in Example 1.

Evaluations on Various Items

The copper foil with a carrier of each of Examples 1 to 9 was subjected to evaluation on the following items. The results are shown in Table 1.

<Heat resistance of Carrier>

The carrier 12 used in each example was prepared as a separate item and its heat resistance was tested to evaluate the heat press resistance. Specifically, the carrier 12 was placed on a hot plate, which was then gradually heated from room temperature in an air atmosphere. The presence or absence of cracking in the carrier 12 was observed every time the temperature rose by 10° C. from 200° C. to rate the cracking based on the following criteria.

Rank AA: no cracking observed at 290° C. or higher.

Rank A: cracking observed at 260° C. or higher and lower than 290° C.

Rank B: cracking observed at 230° C. or higher and lower than 260° C.

Rank C: cracking observed below 230° C. (unacceptable).

<Laser Drilling Performance>

The silicon-based adhesion layer 20 of the copper foil 10 with a carrier was laminated on the resin face of resin-coated copper foil (RCC) (material: epoxy resin, available from Mitsui Mining & Smelting Co., Ltd.) having a thickness of 30 μm and was pressed at 220° C. for 90 min under a pressure of 30 kgf/cm$^2$. The surface of the carrier 12 of the resulting copper-clad laminate was irradiated with a UV-YAG laser under the following conditions to form a via hole reaching the copper layer in the resin-coated copper foil (RCC).

[Laser Drilling Condition]

Apparatus: UV-YAG laser drilling machine (LUC-2K21, available from Via Mechanics, Ltd.)

Process: Burst mode

Output: 0.93 W (Examples 1 to 4 and 6 to 8) or 5.26 W (Example 5)

Pulse repetition rate: 50 kHz

Number of shots: 42 (Examples 1 to 4 and 6 to 8) or 30 (Example 5)

Target diameter: 30 μm

For the formed via hole, the processing accuracy of the diameter of the via hole with reference to the target diameter (30 μm) was measured to rate the processing accuracy based on the following criteria.

Rank A: processing accuracy within the range of ±3 μm

Rank B: processing accuracy within the range of ±5 μm (excluding those corresponding to Rank A)

Rank C: processing accuracy within the range of ±10 μm (excluding those corresponding to ranks A and B)

<Corrosion Resistance of Carrier Against Desmear Treatment>

The carrier 12 used in each example was prepared as a separate item and its resistance to sodium permanganate was tested to evaluate the corrosion resistance against the desmear treatment. In detail, the carrier 12 was immersed in a sodium permanganate solution (sodium permanganate content: 12% by volume, product name: MLB 213, available from Atotech Japan K.K.) at 80° C. for 30 min to measure the weight loss due to elution of the carrier to rate the corrosion resistance based on the following criteria.

Rank A: less than 5 wt % by weight
Rank B: 5 wt % or more and 10 wt % or less
Rank C: 10 wt % or more (unacceptable)

<Corrosion Resistance of Release Layer Against Desmear Treatment>

In order to evaluate the corrosion resistance of the release layer (i.e., the silicon layer 14 and the carbon layer 16) against the desmear treatment, the copper-clad laminate having a via hole formed by the laser workability test was treated in a sodium permanganate solution, and the amount of the chemical solution eluted from the via hole end was evaluated.

This desmear treatment was carried out by sequentially carrying out the following procedures with the process solution shown below (available from Rohm and Haas Electronic Materials Co., Ltd)

[Swelling Treatment]
Process solution: 20 vol % (800 mL/4 L) Circuposit MLB Conditioner 211 and 10 vol % (400 mL/4 L) Circuposit Z
Process conditions: immersion for 5 min at 75° C.

[Permanganic Acid Treatment]
Process solution: 12 vol % (480 mL/4 L) Circuposit MLB promoter 213A-1 and 15 vol % (600 mL/4 L) Circuposit MLB promoter 213 B-1
Process conditions: immersion for 5 min, 10 min, 20 min, or 30 min at 80° C.

[Neutralization Process]
Process solution: 5 vol % (200 mL/4 L) Circuposit MLB Neutralizer 216-5
Process conditions: immersion for 5 min at 45° C.

The copper-clad laminate after the desmear treatment was dried at 120° C. for 5 min. The carrier 12 was peeled off from the copper-clad laminate and the amount of erosion at the interface between the extremely thin copper layer 18 and the resin-coated copper foil (RCC) was measured by microscopic observation. The area through which the sodium permanganate solution passed at the interface between the extremely thin copper layer 18 and the resin-coated copper foil (RCC) was colored. The vicinity of the via hole of the copper-clad laminate subjected to the desmear treatment was observed to determine the amount of erosion by measuring the maximum reaching distance from the edge of the via hole in the colored area caused as a result of erosion of the chemical solution. The maximum reachable distance from the edge was rated based on the following criteria.

Rank A: Chemical solution erosion amount from the via hole edge of 10 μm or less
Rank B: Chemical solution erosion amount from the via hole edge of more than 10 μm and 50 μm or less
Rank C: Chemical solution erosion amount from via hole end exceeding 50 μm (unacceptable)

<Carrier Peel Strength>

The peeling strength after vacuum hot pressing in a copper foil with a carrier was measured as follows. The silicon-based adhesion layer 20 of the copper foil 10 with a carrier was laminated on the resin face of resin-coated copper foil (RCC) (material: epoxy resin, available from Mitsui Mining & Smelting Co., Ltd.) having a thickness of 30 μm and was pressed at 220° C. for 90 min under a pressure of 30 kgf/cm$^2$. In accordance with JIS C 6481-1996, the peeling strength (gf/cm) of the resulting carrier-clad laminate was measured by peeling off the carrier foil with a measuring area of 50 mm×20 mm. The resulting peel strength (average value) was rated based on the following criteria.

Rank A: peel strength of 10 to 30 gf/cm
Rank B: peel strength of 5 to 50 gf/cm
Rank C: peel strength of less than 5 gf/cm or greater than 50 gf/cm (unacceptable)

<Overall Evaluation>

All of the above evaluations were combined to be ranked in the following criteria.

Rank A: having neither Rank C (unacceptable) nor Rank B
Rank B: having no Rank C (unacceptable) and having Rank B
Rank C: having Rank C (unacceptable)

TABLE 1

| | | Release film | | Heat resistance | Laser drilling performance Tolerance size | Corrosion resistance against desmear treatment | | Carrier | |
|---|---|---|---|---|---|---|---|---|---|
| | | | | | | Corrosion resistance of carrier Weight reduction rate | Corrosion resistance of release layer (chemical solution | | |
| | Type of carrier | Type of release layer on carrier | Carbon layer thickness (nm) | Temperature at which cracking occurred. | (via hole diameter accuracy) | (sodium permanganate resistance) | erosion from the via hole end by desmear treatment) | peel strength (gf/cm) | Overall evaluation |
| Ex. 1 | PEN | Silicon layer | 1.5 | 240° C. B | ±1 μm A | 3% A | 2 μm A | 15 A | B |
| Ex. 2 | PES | Silicon layer | 3.0 | 290° C. AA | ±2 μm A | 3% A | 3 μm A | 20 A | A |
| Ex. 3* | PEN | Aluminum layer | 1.5 | 240° C. B | ±2 μm A | 20% C | 80 μm C | 15 A | C |
| Ex. 4 | PPS | Silicon layer | 1.5 | 290° C. AA | ±1 μm A | 2% A | 2 μm A | 18 A | A |
| Ex. 5* | Cu | Titanium layer | 1.5 | 300° C. or more AA | ±12 μm C | <1% A | 2 μm A | 20 A | C |
| Ex. 6* | PET | Silicon layer | 1.5 | 200° C. C | ±10 μm C | 18% C | 60 μm C | 25 A | C |
| Ex. 7* | PEN | Titanium layer | 0.5 | 240° C. B | ±1 μm A | 3% A | 2 μm A | 2 C | C |

TABLE 1-continued

| | | Release film | | Heat resistance | Laser drilling performance Tolerance size | Corrosion resistance against desmear treatment | | | |
|---|---|---|---|---|---|---|---|---|---|
| | | | | | | Corrosion resistance of carrier Weight reduction rate | Corrosion resistance of release layer (chemical solution | Carrier | |
| | Type of carrier | Type of release layer on carrier | Carbon layer thickness (nm) | Temperature at which cracking occurred. | (via hole diameter accuracy) | (sodium permanganate resistance) | erosion from the via hole end by desmear treatment) | peel strength (gf/cm) | Overall evaluation |
| Ex. 8* | PES | Titanium layer | 5.0 | 280° C. A | ±2 μm A | 3% A | 80 μm C | 55 C | C |
| Ex. 9* | PI | Silicon layer | 1.5 | 300° C. or more AA | ±1 μm A | 8% B | 30 μm B | 20 A | B |

*denotes comparative examples.

The invention claimed is:

1. A copper foil comprising:
a carrier comprising at least one resin selected from polyethylene naphthalate resins, polyethersulfone resins, polyimide resins, and polyphenylene sulfide resins;
a silicon layer provided on the carrier;
a carbon layer provided on the silicon layer; and
a copper layer provided on the carbon layer, the copper layer having an arithmetic average roughness Ra of 1.0 to 50 nm measured according to JIS B 0601-2001.

2. The copper foil according to claim 1, wherein the silicon layer has a silicon content of 60 atom % or more.

3. The copper foil according to claim 1, wherein the silicon layer has a thickness of 1 to 50 nm.

4. The copper foil according to claim 1, wherein the carbon layer has a thickness of 0.1 to 10 nm.

5. The copper foil according to claim 1, wherein the copper layer has a thickness of 50 to 2500 nm.

6. A resin-coated copper foil comprising:
the copper foil according to claim 1, and
a resin composition layer provided on the copper layer of the copper foil.

7. The copper foil according to claim 1, further comprising a silicon-based adhesion layer on the copper layer, the silicon-based adhesion layer including 60 to 98 atom % silicon, 1.0 to 35.0 atom % carbon, and 1.0 to 40.0 atom % oxygen.

8. A method for manufacturing a printed circuit board comprising:
laminating a resin layer and the copper foil in sequence on at least one side of a core layer to form a laminate, the copper foil including:
a carrier comprising at least one resin selected from polyethylene naphthalate resins, polyethersulfone resins, polyimide resins, and polyphenylene sulfide resins;
a silicon layer provided on the carrier;
a carbon layer provided on the silicon layer; and
a copper layer provided on the carbon layer, the copper layer having an arithmetic average roughness Ra of 1.0 to 50 nm measured according to JIS B 0601-2001;
forming a via hole by laser drilling of the laminate,
desmear treating the laminate for removing smears from the via hole, and
removing the carrier after the desmear treating.

9. The method according to claim 8, further comprising performing an electroless copper plating between the desmear treating and the carrier removing or after the carrier removing.

10. A method for manufacturing a printed circuit board comprising:
laminating a copper foil on at least one side of a core layer to form a laminate, and a resin composition layer provided on a copper layer of the copper foil, the copper foil including:
a carrier comprising at least one resin selected from polyethylene naphthalate resins, polyethersulfone resins, polyimide resins, and polyphenylene sulfide resins;
a silicon layer provided on the carrier;
a carbon layer provided on the silicon layer; and
the copper layer provided on the carbon layer and having an arithmetic average roughness Ra of 1.0 to 50 nm measured according to JIS B 0601-2001;
forming a via hole by laser drilling of the laminate,
desmear treating the laminate for removing smears from the via hole, and
removing the carrier after the desmear treating.

11. The method according to claim 10, further comprising performing an electroless copper plating between the desmear treating and the carrier removing or after the carrier removing.

* * * * *